United States Patent
Pelc et al.

[11] Patent Number: 5,615,677
[45] Date of Patent: Apr. 1, 1997

[54] MRI TRACKING OF CYCLICAL MOTION BY FOURIER INTEGRATION OF VELOCITY

[75] Inventors: Norbert J. Pelc, Los Altos; Yudong Zhu, Stanford, both of Calif.

[73] Assignee: The Board of Trustees of the Leland Stanford Junior University, Stanford, Calif.

[21] Appl. No.: 511,501

[22] Filed: Aug. 4, 1995

[51] Int. Cl.⁶ ................................................ A61B 5/055
[52] U.S. Cl. .................................. 128/653.2; 128/653.3; 128/661.09; 128/662.02; 128/664; 128/665; 356/27; 356/28; 356/28.5; 324/306; 324/309
[58] Field of Search ............................ 128/653.2, 653.3, 128/661.09, 662.01, 660.05, 660.02; 324/306, 309; 356/27, 28, 28.5

[56] References Cited

U.S. PATENT DOCUMENTS

| | | | |
|---|---|---|---|
| 4,930,513 | 6/1990 | Mayo et al. | 128/661.09 |
| 5,257,625 | 11/1993 | Pelc | 128/653.2 |
| 5,257,626 | 11/1993 | Pelc et al. | 128/653.2 |
| 5,285,788 | 2/1994 | Arenson et al. | 128/660.05 |
| 5,318,026 | 6/1994 | Pelc | 128/653.2 |
| 5,415,171 | 5/1995 | Goh et al. | 128/660.07 |

*Primary Examiner*—Marvin M. Lateef
*Assistant Examiner*—Eleni Mantis Mercader
*Attorney, Agent, or Firm*—Townsend and Townsend and Crew; Henry K. Woodward

[57] ABSTRACT

A closed-form integration method is derived and analyzed for computing motion trajectories from velocity field data, in particular as measured by phase contrast cine (PC) MR imaging. By modeling periodic motion as composed of Fourier harmonics and integrating the material velocity of the tracked point in the frequency domain, this method gives an unbiased trajectory estimate in the presence of white measurement noise and eddy current effects. When applied to practical data, the method can incorporate compensation for the frequency response of the data acquisition method, offering a further improvement on the tracking accuracy. In simulation and phantom studies, the estimated trajectories were in excellent agreement with the true trajectories. Encouraging results have also been obtained on data from human beings.

18 Claims, 9 Drawing Sheets

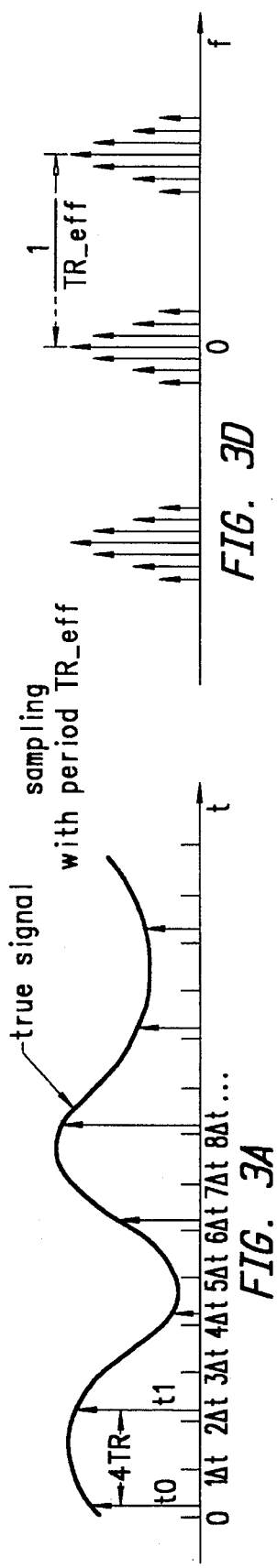
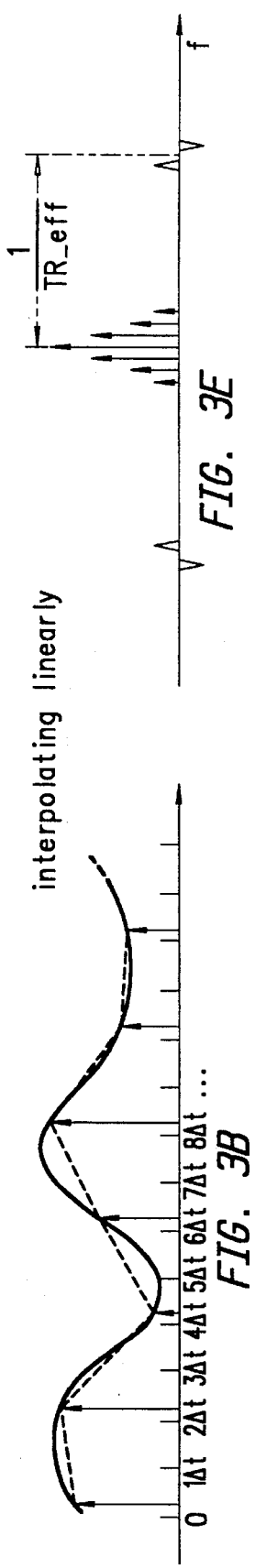
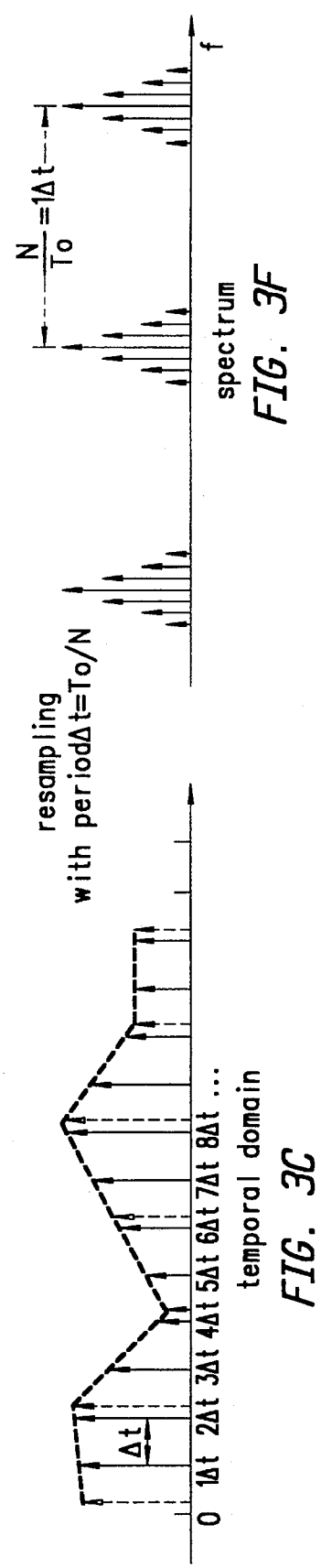
FIG. 3A
FIG. 3B
FIG. 3C
FIG. 3D
FIG. 3E
FIG. 3F

FIG. 10A  FIG. 10B
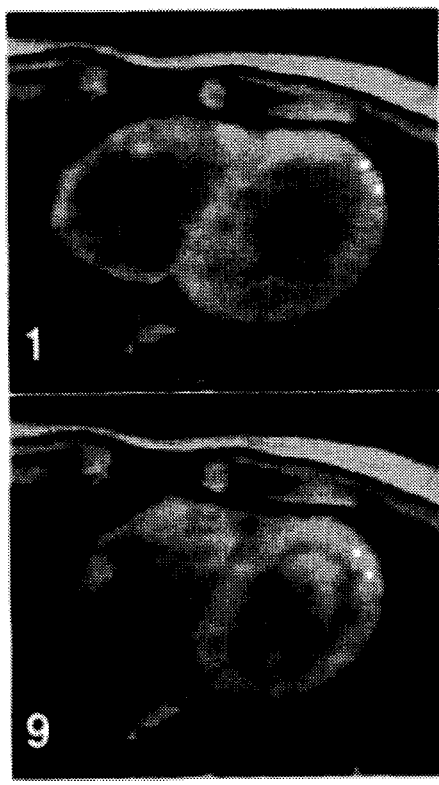
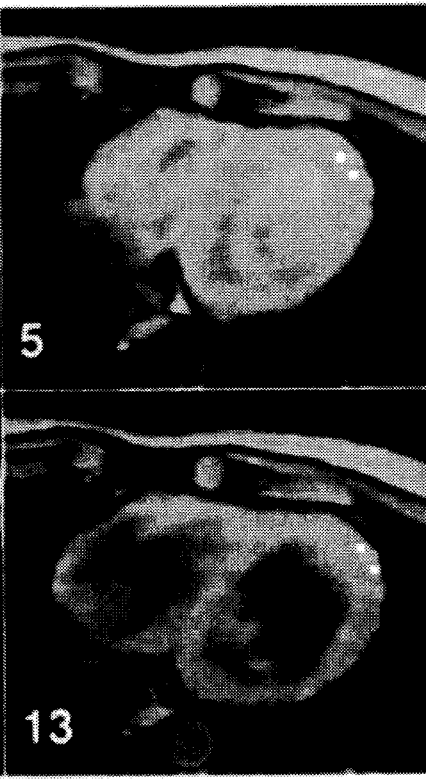
FIG. 10C  FIG. 10D

MRI TRACKING OF CYCLICAL MOTION BY FOURIER INTEGRATION OF VELOCITY

BACKGROUND OF THE INVENTION

This invention relates generally to nuclear magnetic resonance imaging (MRI), and more particularly the invention relates to motion analysis and imaging of an organ such as the heart using phase contrast MRI maps of tissue velocity in the organ.

Methods to calculate the cyclical motion of a portion of an object using phase contrast cine MRI are known. Basically, the phase contrast MRI technique provides maps of vector velocity in the object throughout the motion cycle.

A basic concept is described in U.S. Pat. No. 5,195,525. With this technique the operator selects a region to be tracked by identifying its location in the first frame of the cine image set. The velocity in the region in the first frame is used to calculate its expected location in the second frame. The vector velocity in the second frame at the new location as portrayed in the cine set is used to calculate the position in the third frame, and so on. This tracking can be performed in 3D and promises to yield important information about cardiac motion noninvasively. Higher order integration methods can be used to improve the motion estimate.

An improvement to this method integrates the velocities in both the forward and backward temporal directions. This method, called forward-backward integration, has improved precision and accuracy and is described in "Tracking of Cyclical Motion with Phase-Contrast Cine MRI Velocity Data," JMRI, Vol. 5, pp. 339–345, 1995, and also in U.S. Pat. No. 5,257,626. Another improvement, called forced closure, estimates the additive velocity errors that might be present and corrects for these, improving the quality of the computed motion. This concept is described in U.S. Pat. No. 5,257,625.

Another method for integrating the motion from the velocity data is described in a pending U.S. Pat. application Ser. No. 08/381,801, "Iterative Method of Determining Trajectory of a Moving Region in a Moving Material Using Velocity Measurements in a Fixed Frame of Reference," filed Feb. 1, 1995 by Samuel M. Song and Norbert J. Pelc. In this method, a first trajectory estimate, for example as produced by the forward-backward method, is iteratively refined to arrive at a trajectory that is most consistent with the velocity along the trajectory. In contrast to the other techniques which are recursive, the Song method arrives at the trajectory estimate for one iteration using only the trajectory at the previous iteration and the measured velocity data.

These methods have variable tendency to underestimate motion due to the limitations of the integration model order used. There is a more serious tendency to underestimate motion with these methods due to the limited temporal resolution of the acquired cine-PC data, specifically due to the linear interpolation used in the cine processing. The present invention overcomes these limitations and provides more accurate motion measurements.

SUMMARY OF THE INVENTION

The present invention employs Fourier tracking of object motion such as myocardial motion using cine-PC data. Integration is done using Fourier analysis, which avoids the underestimation of linear or other integration models. The invention can easily incorporate compensation for the imperfect but known frequency response of the method used to acquire the velocity data. Further, the accuracy of the new method is better than that of the forward-backward method while the noise with the two methods are comparable.

The new tracking algorithm uses an iterative scheme to obtain the material velocity of tracked regions and to refine trajectory estimates. Based on the assumption of periodic motion, the algorithm models trajectories as composed of Fourier harmonics and integrates the velocity data in the frequency domain. This solves the underestimation problem suffered by the f-b (forward-backward) method. The Fourier integration method also facilitates efficient compensation for the cine interpolation effects.

The invention and objects and features thereof will be more readily apparent from the following detailed description and appended claims when taken with the drawings.

BRIEF DESCRIPTION OF THE DRAWINGS

FIGS. 3A–3F illustrate an analysis of one interpolation scheme of cine PC MRI.

FIGS. 10A–10D are magnitude images of a human subject for frames 1, 5, 9, and 13 out of 16 frames in a cycle.

DETAILED DESCRIPTION OF ILLUSTRATIVE EMBODIMENTS

The following description begins with a formulation of the new Fourier tracking algorithm followed by an analysis of the accuracy and precision in applying the Fourier tracking. Results of computer simulation, phantom validation, and human application are then presented, and the MRI system in which the method is implemented is described.

Theory

Let $\vec{v}(r,t)$ or $\vec{v}(x,y,z,t)$ denote object velocity at spatial location $\vec{r}$ at time t. PC MRI can provide a sampled version of this time dependent velocity field. Due to eddy current induced measurement error and random noise, however, the samples are degraded and can be described as:

$$\hat{\vec{v}}_{i,j,k,n} = \vec{v}(i\Delta x, j\Delta y, k\Delta z, n\Delta t) + \vec{c}(i\Delta x, j\Delta y, k\Delta z, n\Delta t) + \vec{\epsilon}_{i,j,k,n}. \quad (1)$$

where i, j, k, and n are sample indices in the x, y, z and time directions respectively, $\Delta x$, $\Delta y$, $\Delta z$ and $\Delta t$ are the corresponding sampling intervals, $\vec{\epsilon}$ denotes the noise, and $\vec{c}$ is the eddy-current-induced velocity offset. Corrections can be applied to the data to reduce the eddy current-induced effects; in such cases $\vec{c}$ corresponds to any residual errors.

An iterative scheme. The basic concept in velocity-based motion tracking is to integrate velocity samples of the object with respect to time. To compute the trajectory of a region within the object, the region's material velocity (Lagrangian velocity) during the cycle is needed. Unfortunately, PC MRI yields velocity samples on a stationary coordinate system (Eulerian velocity). Without knowledge of the motion trajectory, one cannot correctly address the velocity data for integration.

We use an iterative scheme to solve this problem. Beginning with a coarse estimate of the trajectory, the algorithm integrates the velocity data along the trajectory with respect to time to get a refined estimate:

$$\{\hat{\vec{r}}_{new}(n\Delta t)), n\epsilon[0,N-1]\} = \text{INTEGRATE}\{\hat{\vec{v}}(\hat{\vec{r}}_{old}(n\Delta t), n\Delta t), n\epsilon[0, N-1]\}, \quad (2)$$

where $\hat{\vec{r}}_{old}$ and $\hat{\vec{r}}_{new}$ are the old trajectory estimate and its refinement, respectively, and N is the total number of time frames. This refining process is continued until satisfactory convergence is reached and a trajectory estimate that is most consistent with the velocity data is obtained.

In order for the iteration process to converge to a trajectory estimate that is close to the true trajectory, the integration needs to be as accurate as possible, void of artifacts or bias, and robust against noise and eddy current effects.

Figure 1:
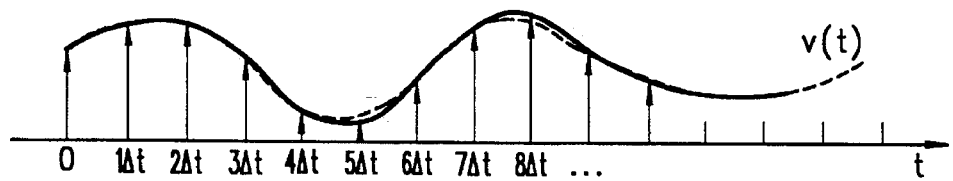
FIG. 1 illustrates that the f-b method is equivalent to integrating the linear interpolation of the N velocity samples followed by sampling of the result.

The integration method. Integration of the sampled velocity data must use a model for the velocity during frame intervals. The f-b algorithm assumes that the velocity varies linearly during each interval. As a result, the integrated trajectories deviate from the true trajectories even when the algorithm uses accurate material velocity samples and there is no aliasing caused by the sampling process. This arises because with the linear model, there is an inherent attenuation of the k-th harmonic of the velocity data sequence according to $\text{sinc}^2(T_0/N\ f)|_{f=k/T_0}$ where $T_0$ is the heart period (FIG. 1), and hence a $100(1-\text{sinc}^2(k/N))$ percent underestimation of the k-th harmonic of the true trajectory (e.g., 1.28% for the 1st harmonic, 5.04% for the 2nd harmonic, and 11.04% for the 3rd, etc.). This effect can be reduced if a higher order polynomial interpolation model is used.

Rather than using a polynomial model, the new method described here uses a Fourier model which takes advantage of the periodicity of the measured data and any depicted motion. The heart period $T_0$ implies a fundamental frequency of $1/T_0$ for both the true trajectory of a tracked region $\vec{r}(t)$ and the velocity along it $\vec{v}(\vec{r}(t),t)$. With sampling period $\Delta t = T_0/N$, it can be shown that, if the Nyquist condition is satisfied, then except at 0 and the Nyquist frequency, the DFT of the true trajectory samples $\vec{r}(n\Delta t)$ is related to the DFT of the velocity samples along the trajectory $\vec{v}(\vec{r}(n\Delta t), n\Delta t)$. by:

$$DFT\{\vec{r}(n\Delta t)\}|_k = \frac{DFT\{\vec{v}(\vec{r}(n\Delta t), n\Delta t)\}|_k}{\tilde{M}\left(\frac{k}{T_0}\right)}, k \in [0, N-1], \quad (3)$$

where $\tilde{M}(f)$ is the periodic extension of the function $j2\pi f\ \text{rect}(f/f_s)$ with period $f_s = 1/\Delta t$. Based on this observation, the Fourier-based integration method computes the Fourier coefficients of the displacement as a function of time by filtering the velocity data using $$H(k) = \begin{cases} 0, & k = 0, N/2 \\ \frac{T_0}{j2\pi k}, & k \in [1, N/2 - 1] \\ \frac{T_0}{j2\pi(k-N)}, & k \in [N - N/2 + 1, N - 1] \end{cases} \quad (4)$$

The iteration scheme can thus be formally described as $$\hat{\vec{r}}_{new} = IDFT\{H(k) \cdot DFT\{\hat{\vec{v}}(\hat{\vec{r}}_{old}(n\Delta t), n\Delta t)\}\} - \vec{o} + \vec{r}(0), \quad (5)$$

where $\vec{o}$ is an offset value that equals $IDFT\{H(k).DFT\{\hat{\vec{v}}(\hat{\vec{r}}_{old}(n\Delta t), n\Delta t)\}\}$ evaluated at time 0. The last two terms force the boundary condition (known starting location) to be satisfied. Since equation (3) holds exactly true as long as the Nyquist condition is satisfied, this closed form integration method avoids the underestimation problem of the f-b integration method.

It can also be shown that this Fourier integration method is equivalent to a least squares formulation. Since the motion is periodic (with fundamental frequency $f_0 = 1/T_0$), Fourier expansion of a true trajectory:

$$\vec{r}(t) = \sum_{k=-M}^{M} \vec{\alpha}_k e^{j2\pi k f_0 t}, M = N/2 - 1 \quad (6)$$

yields a model of the velocity data along it:

$$\vec{v}(\vec{r}(t), t) = \sum_{k=-M}^{M} \vec{\alpha}_k (j2\pi k f_0) e^{j2\pi k f_0 t}. \quad (7)$$

As the estimated trajectory approaches the true trajectory, the velocity along the estimate will agree with the model more and more accurately. Assuming slow spatial variation of the velocity field, refinement of a coarse trajectory estimate can be formulated as a least squares error modeling problem. Given the velocity waveform along a trajectory estimate with a sampling rate of $1/\Delta t$, $\vec{a}_k$'s are computed so as to minimize the quantity $$\sum_{n=0}^{N-1} \left| \hat{\vec{v}}(\vec{r}_{old}(n\Delta t), n\Delta t) - \sum_{k=-M}^{M} \vec{\alpha}_k (j2\pi k f_0) e^{j2\pi k f_0 \Delta t n} \right|^2 \quad (8)$$

Let $[\hat{\vec{V}}_0\ \hat{\vec{V}}_1\ \ldots\ \hat{\vec{V}}_{N-1}]^T$ denote the DFT of $[\hat{\vec{v}}_0\ \hat{\vec{v}}_1\ \ldots\ \hat{\vec{v}}_{N-1}]^T$. The solution to the minimization problem can be expressed as $$\vec{\alpha} = \begin{cases} \frac{1}{N} \frac{1}{j2\pi k f_0} \hat{\vec{V}}_k, & \kappa \in [1, M] \\ \frac{1}{N} \frac{1}{j2\pi k f_0} \hat{\vec{V}}_{N+k}, & \kappa \in [-M, -1] \end{cases} \quad (9)$$

The trajectory estimate constructed using the $\vec{a}_k$'s from equation (9) can be readily shown to be equivalent to the Fourier integration approach. Hence the inventive method is also optimal in the least squares sense.

Effects of velocity offset and noise. In PC data acquisitions, due to eddy currents induced by switched gradients, velocity measurements can be corrupted by additive offset $\vec{c}$ (see equation(1)). The offset has a slow spatial variation across the image plane. Moreover, in cine-PC, $\vec{c}$ is independent of time (frame number) since a steady state is maintained. If the motion is small compared to the spatial variation of $\vec{c}$, the offset affecting the velocity data along the trajectory is approximately a constant $\vec{\delta v}$, i.e., $\vec{v}(\vec{r}(n\Delta t), n\Delta t) = \vec{v}(\vec{r}(n\Delta t), n\Delta t) + \vec{\delta v}$. Therefore, the eddy current effect can only corrupt the DC component of the Fourier transform of $\vec{v}$, and can be eliminated by setting this component to zero. Further, because the true motion is assumed to be periodic, the expected value of the DC component of the true velocity along the trajectory must be zero. Thus, in the context of the Fourier integration model, the eddy current effects can be suppressed by nulling the DC component of the velocity data (see equation (4)).

Noise in the velocity data can also deteriorate the quality of the computed trajectory. Suppose our final estimate is only a small perturbation to the true trajectory and hence $\vec{v}(\vec{r}_{final}(n\Delta t), n\Delta t) = \vec{v}(\vec{r}(n\Delta t), n\Delta t) + \vec{\delta v} + \vec{\epsilon}_n$, the propagation of velocity noise $\vec{\epsilon}_n$ (each component assumed to be white in space and time, with variance $\sigma^2$) into each component (x for example) of the estimated trajectory can be shown to be $$\text{variance } \{\hat{x}_{final}(n\Delta t)\} = \sigma^2 \sum_{j=0}^{N-1} (\bar{h}(n-j) - \bar{h}(-j))^2 \qquad (10)$$

where $\bar{h}$ is the periodic extension of IDFT{H}. The expected value of $\hat{\vec{r}}_{final}(n\Delta t)$ is $\vec{r}(n\Delta t)$, the true trajectory, the method is therefore unbiased.

For the f-b algorithm, on the other hand, assuming linear variation of velocity between adjacent time frames, on the other hand, $$\text{variance } \{\hat{x}_{final}(n\Delta t)\} = \sigma^2 \left(\frac{T_0}{N}\right)^2 (n - n^2/N - 1/2), \qquad (11)$$

$$n = 1, \ldots, N-1.$$

Figure 2:
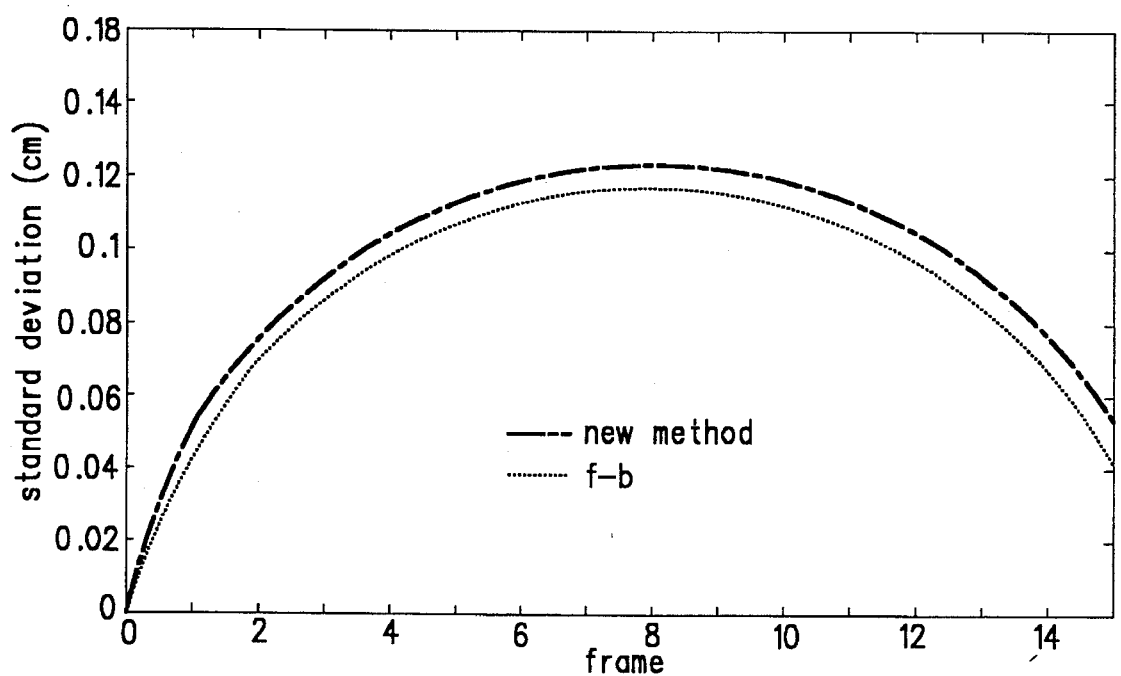
FIG. 2 illustrates a comparison of the precision of the f-b and Fourier integration methods.

A comparison of the standard deviation in the computed trajectory for the two methods based on the above analysis with $\sigma=1$ cm/s, $T_0=1$ s, and $N=16$ is shown in FIG. 2. The two curves are very similar. Both have maximum noise at the mid-point of the cycle, unlike unidirectional integrations. The noise with the new method is slightly higher, 4.2% at the mid-point in the cycle.

Compensation for cine interpolation. In cine PC, the timing of the execution of the pulse sequence is asynchronous with the cardiac cycle, and linear interpolation is used in the temporal domain to produce the k-space data for each desired time frame. This temporal interpolation is equivalent to a sampling-interpolation-resampling process, as illustrated in FIG. 3. Assuming the original signal is band-limited and neglecting side lobes (FIG. 3E), each island of the resultant spectrum (FIG. 3F) is the product of the original signal spectrum with a periodic extension of a segment of $sinc^2$. Hence the interpolation step is effectively a low pass filter, with the signal content at frequency f weighted by $since^2(TR_{eff}f)$, where $TR_{eff}$ is the time between successive execution of sequences with the same velocity sensitivity (with interleaved velocity encoding in all directions $TR_{eff}=$ 4TR).

The Fourier integration algorithm offers an efficient way to compensate for this effect in the temporal frequency domain. An additional weighting coefficient $w_k$ for the k-th harmonic is introduced into the filter so that:

$$H(k) = \begin{cases} 0, & k = 0, N/2 \\ \frac{T_0}{j2\pi k} \omega_k, & k \in [1, N/2 - 1] \\ \frac{T_0}{j2\pi(k-N)} \omega_k, & k \in [N-N/2+1, N-1] \end{cases} \qquad (12)$$

$\omega_k$ is selected to make the net response uniform over all major harmonics to make the net response substantially uniform. If desired, lower response can be used for higher frequency harmonics to handle possible degradation due to temporal aliasing, or to introduce smoothing to reduce the effects of noise.

Although described above in detail for the temporal frequency response of cine MRI with linear interpolation, this is a general approach that can be used to compensate for the frequency response of any acquisition technique.

Algorithm description. In summary, the algorithm begins with a coarse estimate of the trajectory generated by the f-b algorithm. The velocity data along this trajectory are then Fourier transformed, filtered and inverse transformed to yield a new trajectory estimate (equation (5)). The velocity data along the new trajectory estimate are then processed in a similar manner. This process is repeated until satisfactory convergence is obtained.

Methods

Computer simulation studies. Since both the f-b and Fourier algorithms are linear operations on velocity data, the performance of the methods can be evaluated by studying the tracking accuracy with velocity waveforms containing individual frequency components. A data set simulating the velocity field of an object undergoing in-plane rigid translation with $\hat{v}_x = 20 \cos(2\pi(m/T_0)t + 0.8) + 10$ cm/s, sampled 16 times over $T_0$ was generated. The variable m controls the frequency of oscillation; values of 1 and 3 were used. Both algorithms were applied to the resultant data to track the motion of a predefined region.

To study and compare the effects of velocity noise on the f-b and the new methods, another data set that simulated an object undergoing a cyclic deformation pattern was generated such that the x-direction motion was $x(X,Y,t) = a2(t)X^2 + a1(t)X$ cm, where $(X,Y)$ is the initial position of a particle on the object. For this particular study, $a1(t)=1$, $a2(t)=0.2-0.2 \cos(2\pi(3/T_0)t)$. Corresponding time-varying velocity field samples were constructed, and white Gaussian noise with a standard deviation of about 0.6752 cm/s were added. Both methods were then applied to track ten regions that were initially evenly spaced in X from 0.1 to 1.0. This same experiment was performed multiple times to estimate the root mean square errors (from average) of the computed trajectories. The experimentally determined deviations were compared to the theoretical analysis (equations (10) and (11)).

Phantom studies. To test the new algorithm on actual experimental data and to evaluate the effectiveness of the cine interpolation compensation, a phantom composed of a rotating agar-filled cylinder inside of a static annular cylinder was imaged. The rotational velocity was computer controlled and simulated physiological velocities and displacement of the heart wall. Cine PC data were collected on a 1.5T system (Signa, GE Medical Systems, Milwaukee, Wis.), with a quadrature head coil and the cine PC pulse sequence available form the manufacturer. A fixed TR (=23 ms) was used but the period of motion $T_0$ was varied to control number of samples with each velocity encoding during the motion period ($\simeq T_0/TR_{eff}$). Other acquisition parameters were FOV=24 cm, TE=10 ms, flip angle=30°, slice thickness=7 mm, $v_{enc}$=25 cm/s, 256×128 acquisition matrix and NSA=2. The motion of 51 points located about same distance from the center on the phantom were tracked using f-b, Fourier integration, and Fourier integration with compensation ($w_k$'s were selected to make the net response uniform over the first 3 harmonics and zero afterwards). The motion was calculated from trajectory estimates and compared to the actual values. Distances between estimated positions and true positions at all time frames were also calculated for all the regions, and the root mean square values were used to characterize the accuracy of the methods.

Human study. The Fourier tracking method was applied to cine PC data acquired of a human volunteer. A midventricular axial slice was imaged using all-direction cine PC, the body coil, TR/TE of 28/7.1 ms, $v_{enc}$=20 cm/s, 256×192 matrix, NSA=2, 28 cm FOV, 30° flip angle, 7 mm slice thickness, gating using a photoplethysmograph, and respiratory compensation. Spatial presaturation in the S/I direction was used to reduce the signal from blood. Three acquisitions of the same slice were made with the same acquisition parameters to assess reproducibility. The image frames were reordered prior to motion analysis to place the beginning of systole at frame 1.

The reproducibility was evaluated by comparing the tracking results in the three data sets of four 2×2 pixel regions on the left ventricular wall. The root mean square deviation from the average position of each region in each time frame was used to quantify reproducibility. Strain was also estimated by calculating the ratio of the change of distance between two regions to their initial distance. For this purpose, one pair of 2×2 pixel regions in the left ventricular wall was aligned approximately with the radial direction, and the second pair was aligned with the circumferential direction.

Results

Figure 4A:
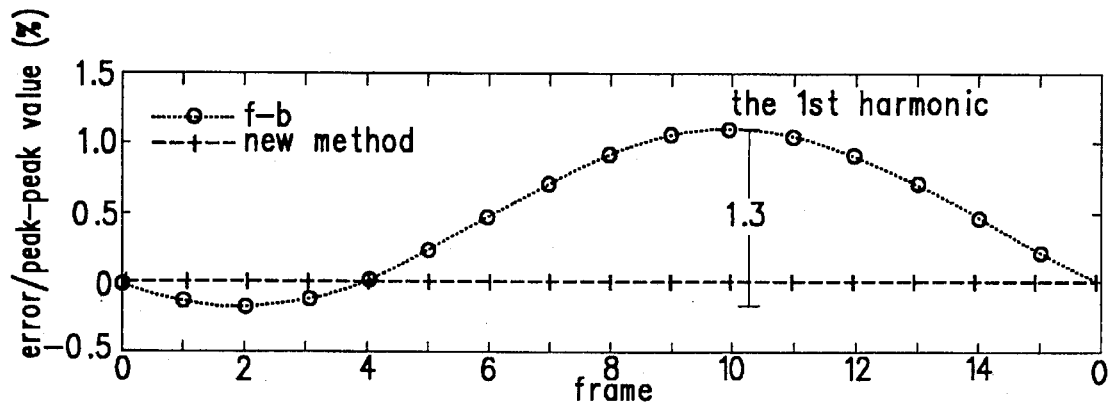
FIGS. 4A, 4B illustrate the difference between the estimated and true locations as a fraction of the peak-peak excursion of true trajectory.
Figure 4B:
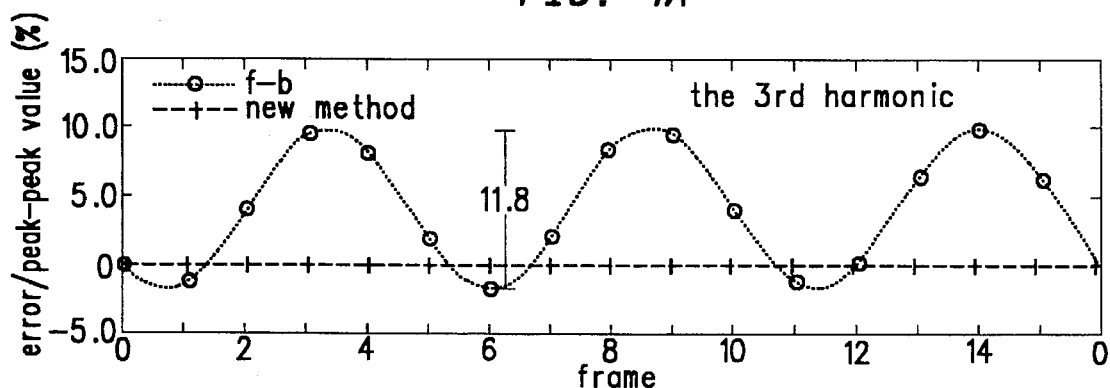

FIGS. 4A and 4B compare the ability of the Fourier and f-b methods to study simulated rigid translation with m of 1 and 3, respectively. Both plots show the difference between the estimated and true locations as a fraction of the peak-peak excursion of the true trajectory. The f-b method has underestimation errors that increase with increasing frequency of motion, as expected theoretically, while the new method is exact.

Figure 5:
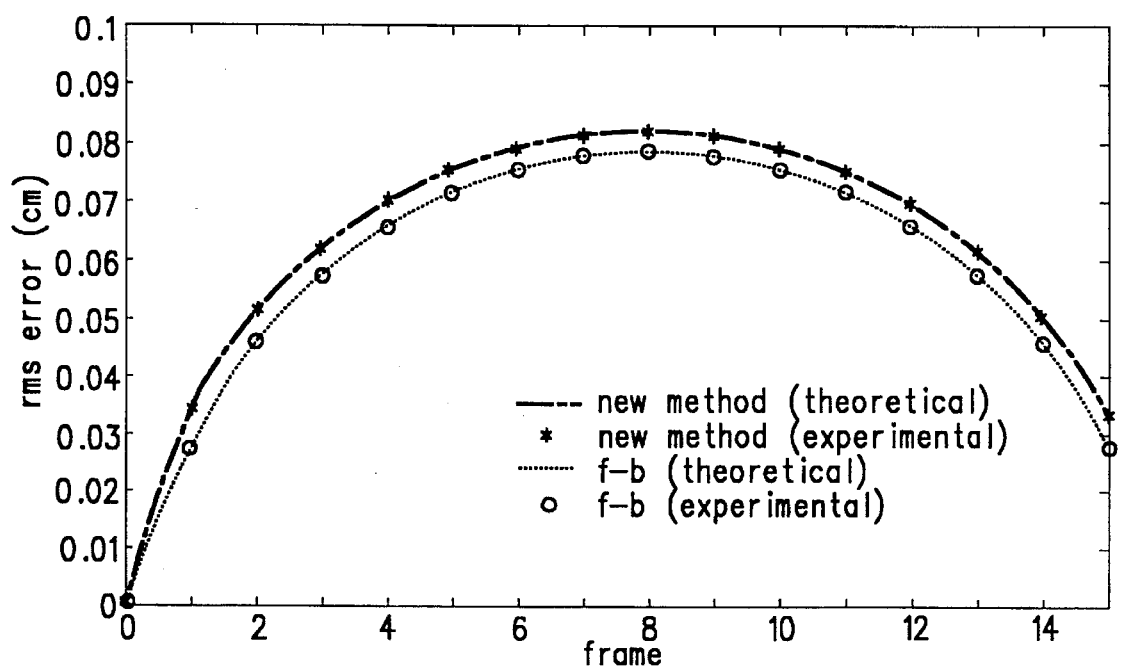
FIG. 5 illustrates the rms trajectory errors of both methods as a function of time in the cycle.

The simulation study of reproducibility was carried out with a total of two thousand experiments. For each time frame, each of the ten region of interest locations, and each algorithm, the deviation of the computed region location from the average over all repeats with that algorithm was calculated. The root mean square (rms) deviation over all repeats and regions was calculated for each algorithm and time frame. FIG. 5 plots the rms trajectory deviation of both methods as a function of time in the cycle, along with the standard deviations that are predicted theoretically (equations (10) and (11)).

Figure 6:
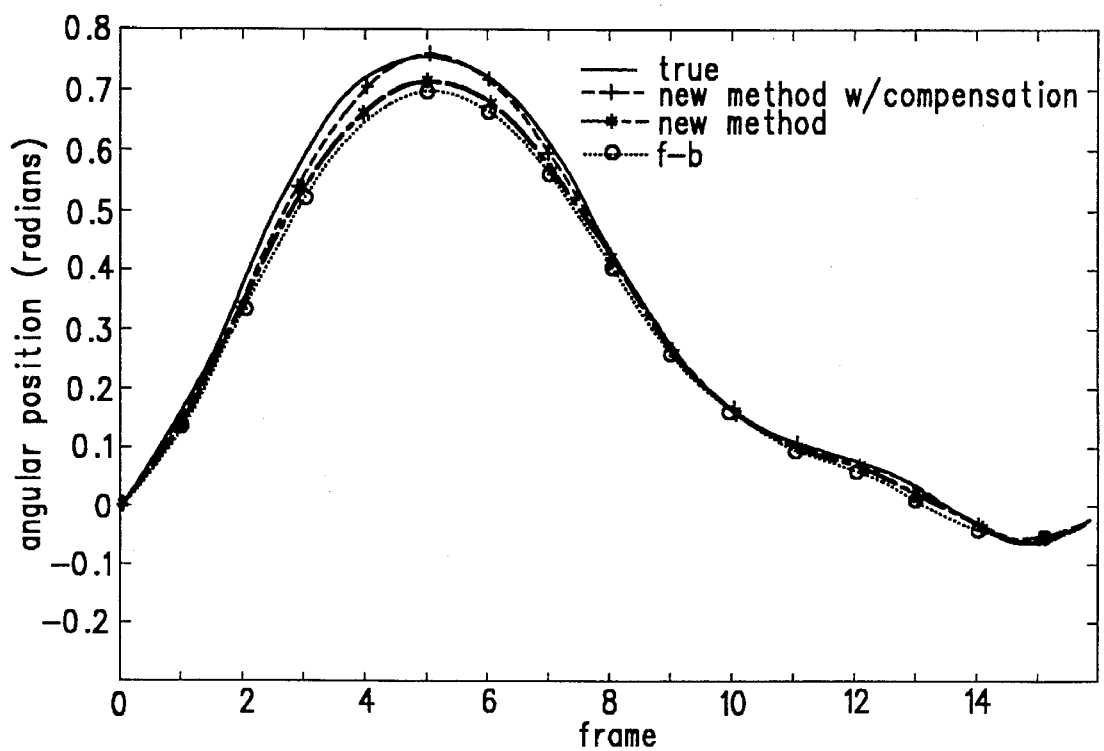
FIG. 6 illustrates a comparison of various algorithms in an experiment in which the motion period was 0.9524 seconds (i.e., 95 bpm—approximately 10.4 samples per cycle).
Figure 7:
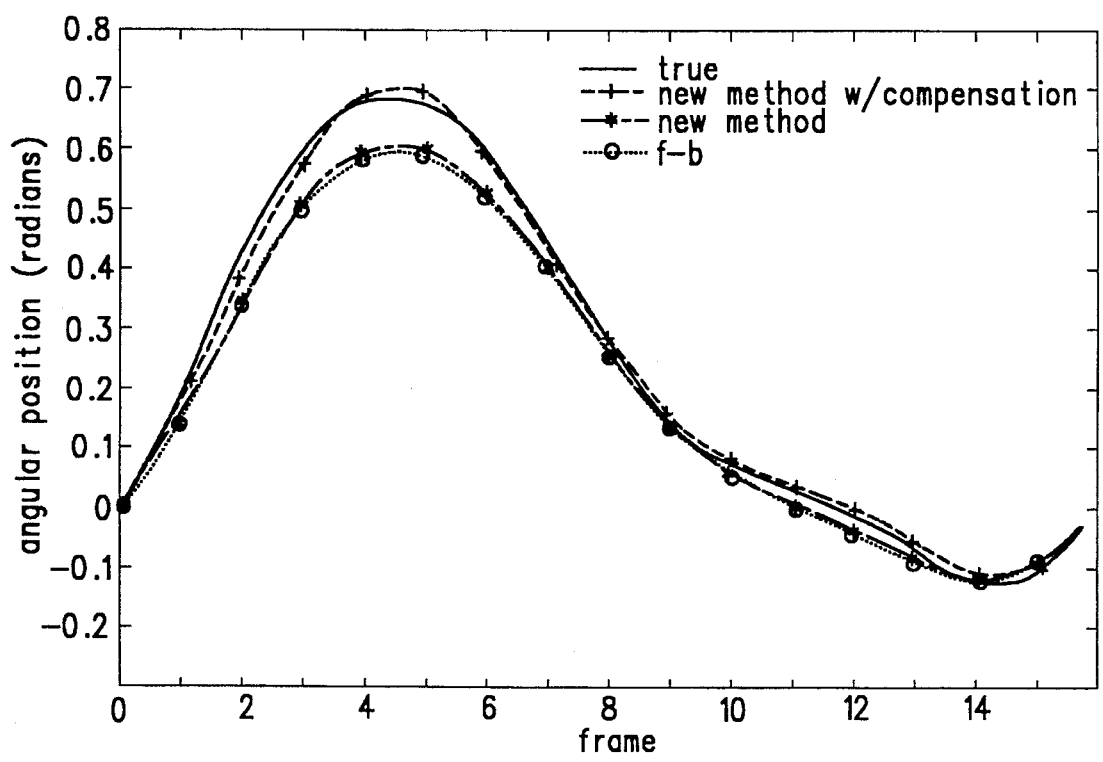
FIG. 7 illustrates a comparison of various algorithms in an experiment in which the motion period was 0.6316 seconds (i.e., 95 bpm—approximately 6.9 samples per cycle).
Figure 8:
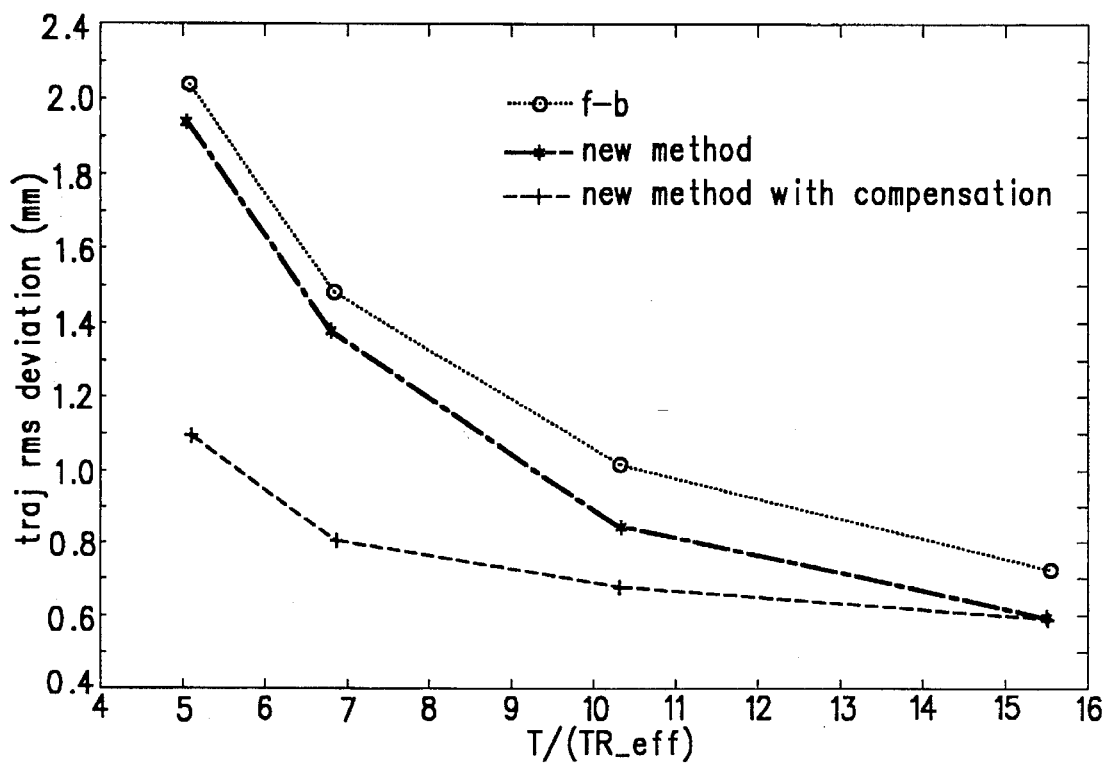
FIG. 8 illustrates the rms value of the difference between the computed positions and the true positions.

For the phantom study, in an experiment where the motion period was 0.9524 seconds (i.e., 63 bpm)—approximately 10.4 samples per cycle were collected with each velocity sensitivity, and 16 frames were produced. FIG. 6 shows the comparison of the various algorithms. FIG. 7 shows the results in another experiment in which the motion period was 0.6316 seconds (i.e., 95 bpm—approximately 6.9 samples per cycle). Data for motion periods of 42 bpm and 127 bpm were also collected and analyzed. The rms value of the difference between the computed positions and the true positions were computed to examine the accuracy of the various methods. The results are shown in FIG. 8. The tracking accuracy is improved when Fourier integration is used; and is improved further when compensation for cine interpolation is added.

Figure 9:
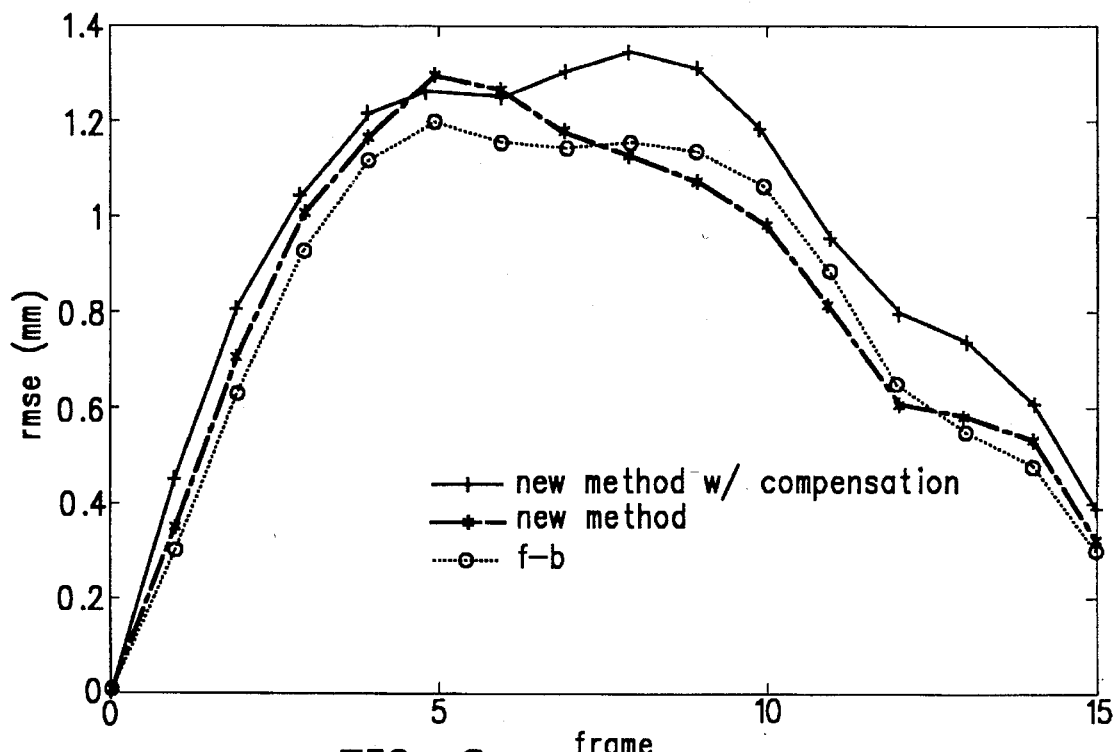
FIG. 9 illustrates a comparison of the reproducibility of the positions calculated with the three algorithms in terms of rms deviation from the average.
Figure 11:
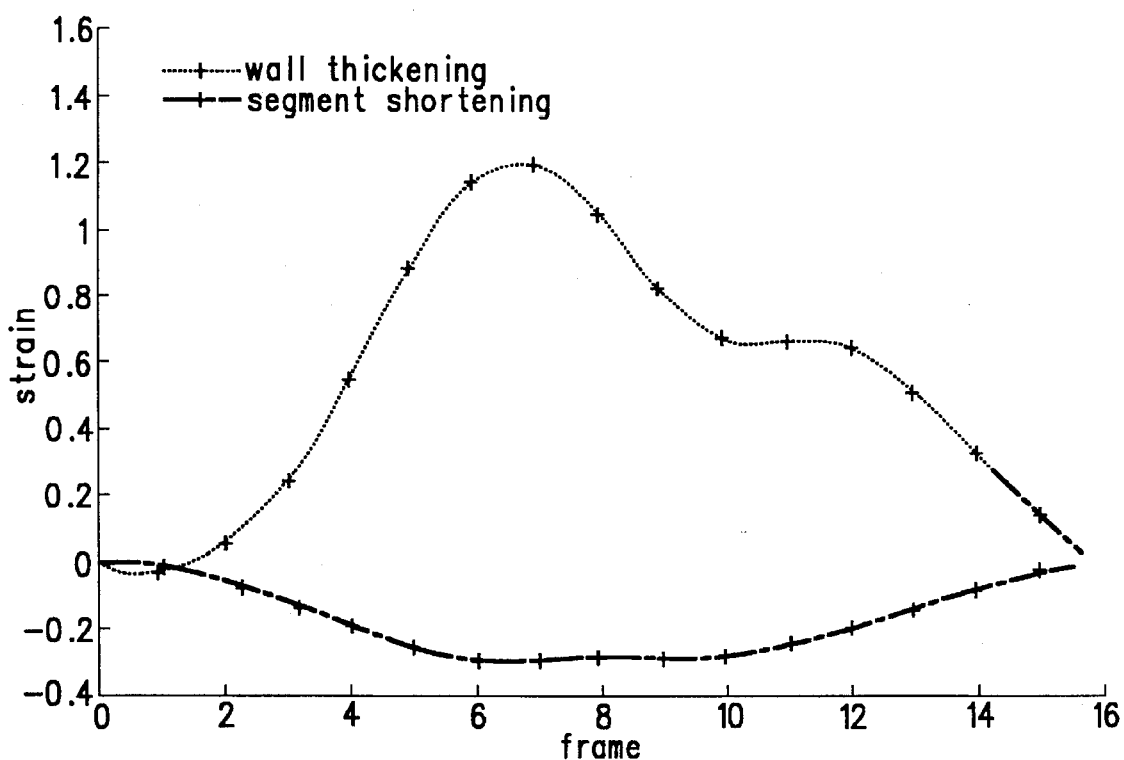
FIG. 11 illustrates strain as computed by Fourier integration with compensation using open and filled-in regions pairs to estimate wall thickening and segmental shortening, respectively.

Image data of the same human volunteer were collected three times using the same parameters. Four of 2×2 pixel regions were defined such that one pair was approximately aligned with the radial direction and the other approximately with the circumferential direction. FIG. 10 shows four time frames from one of the data sets with two regions shown as open and the other two as filled-in squares. Because of the possibility of slight misregistration and physiological variation between the three data sets, thermal noise is only one component of the observed reproducibility. FIG. 9 compares the reproducibility of the rms deviation from the average positions calculated with the three algorithms. FIG. 11 shows the strain as computed by Fourier integration with compensation using the pair of regions that are open (for wall thickening) and the pair that are filled-in (for segmental shortening) in one of the data sets.

By modeling the motion as a sum of Fourier harmonics, the new tracking method overcomes the f-b method's underestimation problem, which is a bias that worsens with increasing temporal frequency. Based on an analysis of the interpolation process in the acquisition of the velocity data, the filter used to compute the trajectory can be designed to compensate for this effect and to provide a further improvement on the tracking accuracy. Because the time interval between computed time frames is smaller than the time interval between sequences with the same velocity sensitivity, in the examples shown the frequency response of the trajectory produced by the f-b method was limited more by the cine interpolation than by the linear integration model used. This effect is demonstrated in FIGS. 6–7 which show a small improvement from f-b to Fourier integration and a larger improvement when compensation for the cine interpolation is added.

The manner in which the compensation is introduced is only an approximation for two reasons. Firstly, for the applications which use phase contrast MR to collect velocity data, while the cine interpolation is done directly on the k-space data and hence affects the complex image values, the compensation is applied to the velocities, i.e., only the phase term. It therefore assumes that the phase term undergoes the same frequency degradation as the complex image values do. Though the assumption is not true in general, especially at large phase shifts, it appears to be acceptable. Previous work has shown that the spectrum of the velocity waveform is affected by the interpolation process in an approximately linear fashion. This is also supported by the effectiveness of the compensation as shown in this study. Secondly, the cine interpolation introduces a filter on the signal as a function of time at a fixed point in space. The compensation should therefore ideally be done independently for each pixel. In our implementation, it is applied to the material velocity of a region which is moving with time. This approximation allows for a simpler and more efficient implementation and, judging from the quality of our results, also appears to be acceptable. If desired, one could apply the compensation to the complex data in a preprocessing stage separate from the tracking calculation.

The improved accuracy of the Fourier integration method comes at a penalty in noise or reproducibility. As shown by the theoretical analysis and also validated with computer simulation and experimental data, this noise penalty is quite small though (for the simulation data, Fourier integration is about 4% higher than the f-b method at the mid-point in the cycle; for the phantom data, Fourier integration with compensation is about 10% higher).

As the trajectory is computed, the location of a region may not coincide with an image pixel. The implementations of the f-b and Fourier tracking used here both utilized nearest neighbor spatial interpolation to estimate the velocity of the region. Nearest neighbor interpolation assumes constant velocity within each voxel and uses the measurement at the center as the velocity for all particles inside the voxel. As the voxel size increases, the error induced by this assumption can become significant and can degrade tracking accuracy. This error accounts for part of the residual error of the new method, and it can be reduced by a better model of the local velocity fields.

Figure 12:
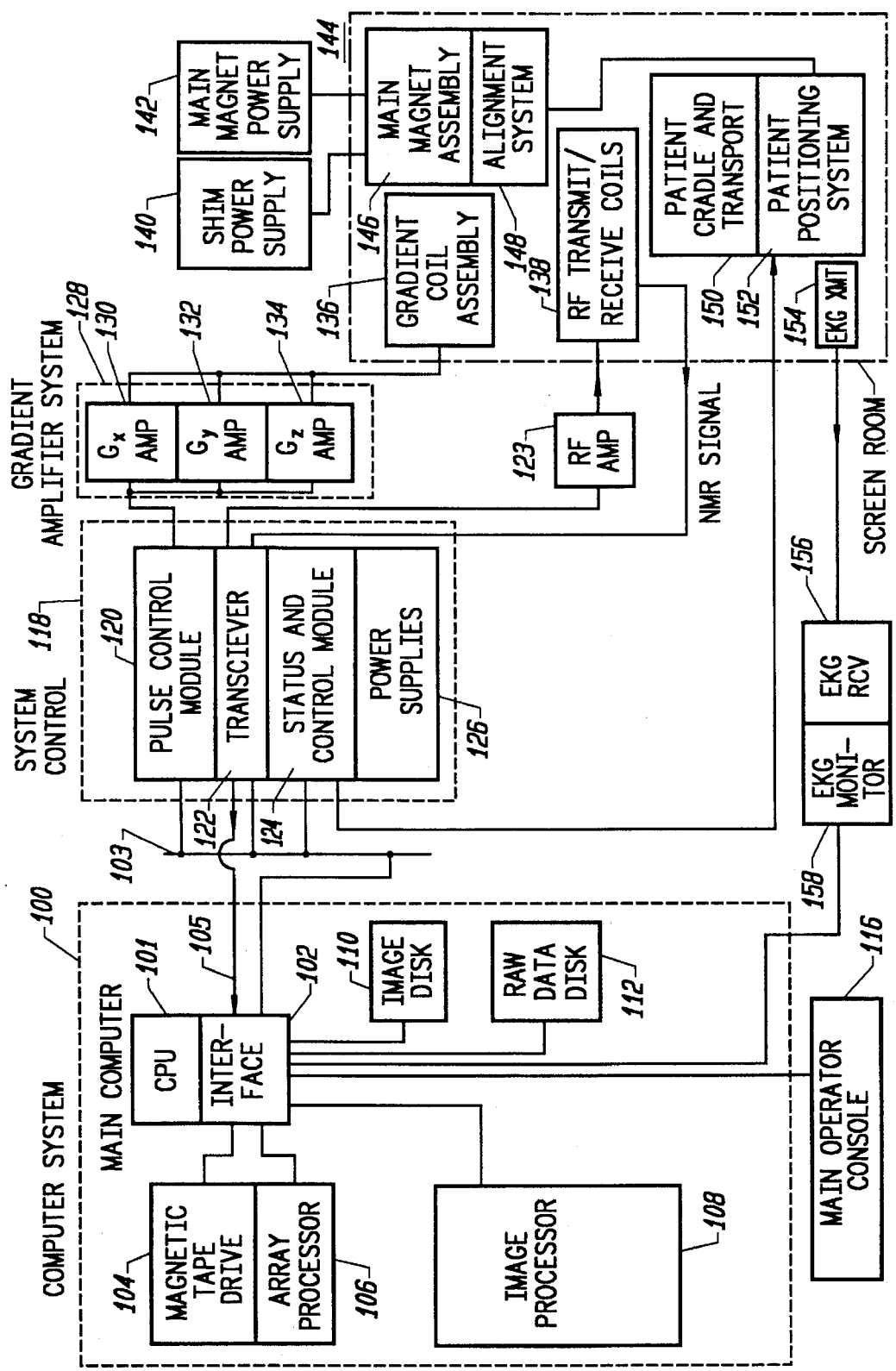
FIG. 12 is a block diagram of an NMR system which employs the invention.

Referring to FIG. 12, there is shown in block diagram form the major components of a preferred NMR system which incorporates the present invention and which is similar to one sold by the General Electric Company under the trademark "SIGNA." The overall operation of the system is under the control of a host computer system generally designated 100 which includes a main computer 101. The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and real time data display. The computer system 100 also includes a means to store raw NMR data (i.e., before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The NMR signals radiated by the excited spins in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152 of the patient cradle and transport 150, as well as to one another by means of serial communications link 103. The PCM 120 and SCM 124 are each comprised of a microprocessor for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 142 is utilized to bring the polarizing field produced by the magnet to the proper operating strength of 1.5 Tesla and is then disconnected.

To minimize interference from external sources, the NMR system components comprised of the magnet, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Also within screen room 144 is EKG transmitter 154 which, through EKG leads (not shown), senses the electrocardiogram (EKG) of the patient (not shown). The sensed EKG signal is transmitted through to EKG receiver 156 to EKG monitor (158), both of which are outside the screen room. EKG monitor processes the EKG signal to derive an EKG trigger which is used by CPU 101 for the timing information necessary for cine MR imaging.

Computer 100 is programmed to execute the motion analysis algorithms described above, and in particular the correction for additive velocity errors of the present invention.

Figure 13:
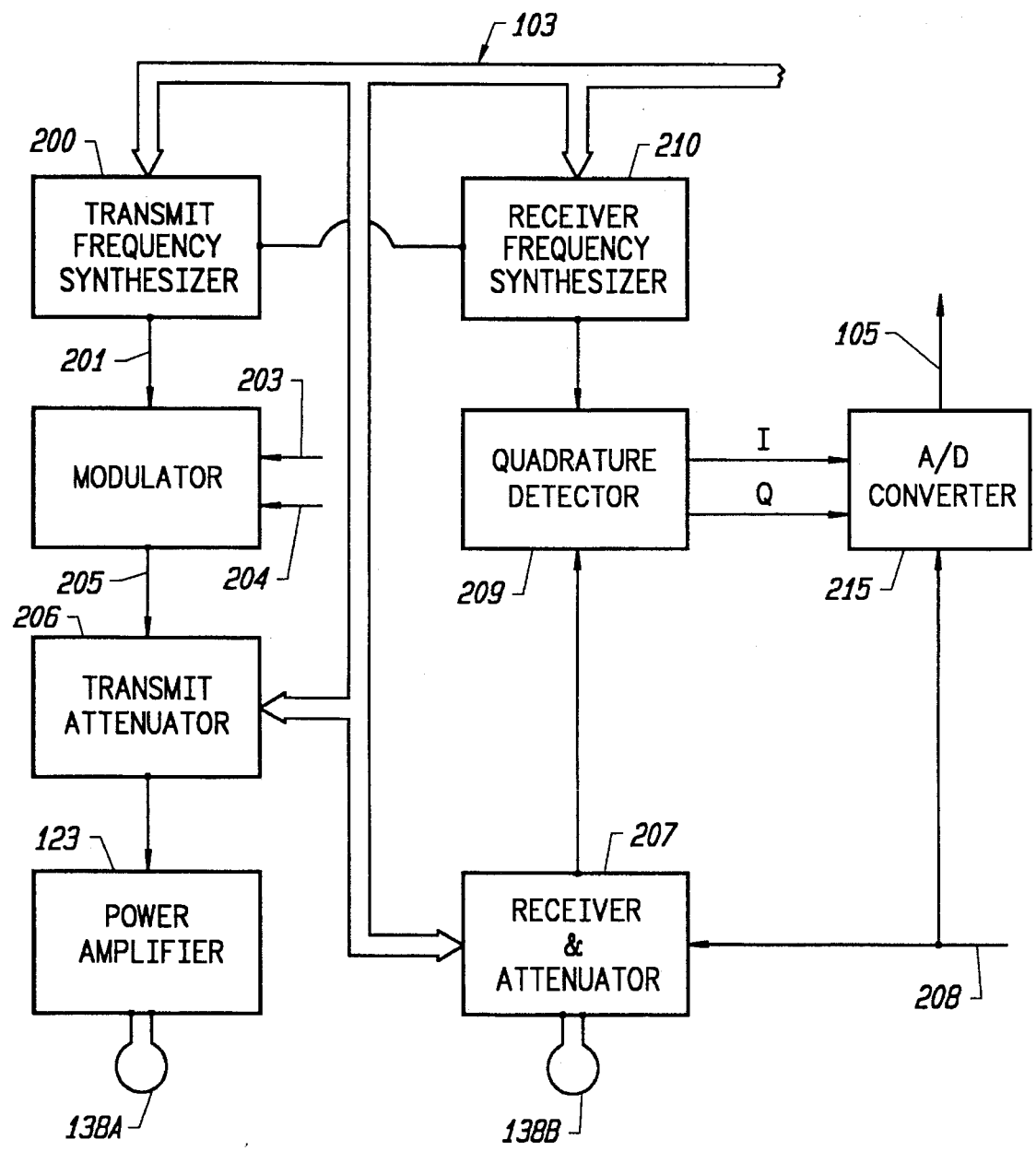
FIG. 13 is an electrical block diagram of the transceiver which forms part of the NMR system of FIG. 12.

Referring particularly to FIGS. 12 and 13 the transceiver 122 includes components which produce the RF excitation field $B_1$ through power amplifier 123 at a coil 138A and components which receive the resulting NMR signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and off in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

The NMR signal produced by the excited spins in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through anti-aliasing filters to a pair of analog to digital converters indicated collectively at 215. The quadrature detector 209 also receives an RF reference signal from a second frequency synthesizer 210 and this is employed by the quadrature detector 209 to sense the amplitude of that component of the NMR signal which is in phase with the RF reference (I signal) and the amplitude of that component of the NMR signal which is in quadrature therewith (Q signal).

The I and Q components of the received NMR signal are continuously sampled and digitized by the A/D converter 215 at a sample rate of 64 kHz throughout the acquisition period. A set of 256 digital numbers are simultaneously acquired for each I and Q component of the NMR signal, and these digital numbers are conveyed to the main computer 101 through the serial link 105. Each pair of numbers is thought of as a complex value equal to I+iQ. The NMR system of FIG. 12 performs a series of pulse sequences to collect sufficient NMR data to track the cyclical motion.

There has been described an improved method and apparatus for tracking cyclical motion using MRI measurements and Fourier integration of velocity fields. While the invention has been described with reference to specific applications, the description is illustrative of the invention and is not to be construed as limiting the invention. For example, other methods, such as Doppler ultrasound or the combination of CT imaging and optical flow algorithms, could be used to obtain velocity data. Various modifications and applications may occur to those skilled in the art without departing from the true spirit and scope of the invention as defined by the appended claims.

What is claimed is:
1. A method of determining a trajectory of a moving particle in a portion of an object comprising the steps of:
   a) obtaining velocity measurements within said object for a plurality of time frames,
   b) estimating a first particle trajectory based on said velocity measurements,
   c) refining the estimated trajectory by:
      i) computing frequency components of velocity along said first particle trajectory using a Fourier transform,
      ii) modifying said frequency components by a filtering function, and
      iii) computing an improved trajectory from the modified frequency components.

2. The method as defined by claim 1 wherein the improved trajectory, $\vec{\hat{r}}_{new}$, is defined by $$\vec{\hat{r}}_{new} = IDFT\{H(k) \cdot DFT\{\vec{v}(\vec{\hat{r}}_{old}(n\Delta t), n\Delta)\}\} - \vec{o} + \vec{r}(0),$$

where

H(k) is the filtering function, k is the index for temporal frequency, $\vec{v}$ is velocity along the first particle trajectory, $\vec{\hat{r}}_{old}$ is the first particle trajectory, n is sample index in time, $\vec{o}$ is an offset value, $\vec{r}(0)$ is the known starting location of the region.

3. The method as defined by claim 2 wherein the filtering function, H(k), is defined by $$H(k) = \begin{cases} 0, & k = 0, N/2 \\ \dfrac{T_0}{j2\pi k}, & k \in [1, N/2 - 1] \\ \dfrac{T_0}{j2\pi(k-N)}, & k \in [N - N/2 + 1, N - 1] \end{cases}$$

where N is the number of time frames, k is the index for temporal frequency.

4. The method as defined by claim 2 wherein the filtering function, H(k), is defined by $$H(k) = \begin{cases} 0, & k = 0, N/2 \\ \dfrac{T_0}{j2\pi k} \omega_k, & k \in [1, N/2 - 1] \\ \dfrac{T_0}{j2\pi(k-N)} \omega_k, & k \in [N - N/2 + 1, N - 1] \end{cases}$$

where N is the number of time frames, k is the index for temporal frequency, and $\omega_k$ is selected to control net frequency response.

5. The method as defined by claim 4 wherein $\omega_k$ is selected to make net response substantially uniform over all major harmonics.

6. The method as defined by claim 1 wherein step a) includes obtaining magnetic resonance cine phase contrast velocity measurement.

7. The method as defined by claim 6 wherein step a) includes
   i) positioning an object in a magnetic field,
   ii) obtaining magnetic resonance image signals representative of at least one velocity component of said particle at a plurality of time frames, and (iii) obtaining measures of said at least one velocity component during said plurality of frames.

8. The method as defined by claim 1 wherein step b) includes estimating a first particle trajectory using a forward-backward integration of velocity measurements.

9. The method as defined by claim 1 wherein step b) further includes using said improved trajectory from step c) iii) in an iterative process.

10. Apparatus for determining a trajectory of a moving particle in a moving material comprising:
   a) means for obtaining signals representative of at least one velocity component of said moving particle at a plurality of time frames,
   b) means for obtaining velocity measurements of said moving particle in each time frame,
   c) means for estimating a first particle trajectory in material coordinates based on said velocity measurements, and
   d) means for refining the estimated trajectory by:
      i) computing frequency components of velocity along said first particle trajectory using a Fourier transform,
      (ii) modifying said frequency components by a filtering function, and
      (iii) computing an improved trajectory from the modified frequency components.

11. Apparatus as defined by claim 10 wherein the improved trajectory, $\hat{\vec{r}}_{new}$, is defined by $$\hat{\vec{r}}_{new} = IDFT\{H(k) \cdot DFT\{\hat{\vec{v}}(\hat{\vec{r}}_{old}(n\Delta t), n\Delta t)\}\} - \vec{o} + \vec{r}(0),$$

where $H(k)$ is the filtering function, $k$ is the index for temporal frequency, $\hat{\vec{v}}$ is velocity along the first particle trajectory, $\hat{\vec{r}}_{old}$ is the first particle trajectory, $n$ is sample index in time, $\vec{o}$ is an offset value $\vec{r}(0)$ is the known starting location of the region.

12. Apparatus as defined by claim 11 wherein the filtering function, $H(k)$, is defined by $$H(k) = \begin{cases} 0, & k = 0, N/2 \\ \dfrac{T_0}{j2\pi k}, & k \in [1, N/2 - 1] \\ \dfrac{T_0}{j2\pi(k-N)}, & k \in [N - N/2 + 1, N - 1] \end{cases}$$

where N is the number of time frames, k is the index for temporal frequency.

13. Apparatus as defined by claim 12 wherein step a) includes obtaining magnetic resonance cine phase contrast velocity measurement.

14. Apparatus as defined by claim 11 wherein the filtering function, $H(k)$, is defined by $$H(k) = \begin{cases} 0, & k = 0, N/2 \\ \dfrac{T_0}{j2\pi k} \omega_k, & k \in [1, N/2 - 1] \\ \dfrac{T_0}{j2\pi(k-N)} \omega_k, & k \in [N - N/2 + 1, N - 1] \end{cases}$$

where N is the number of time frames, k is the index for temporal frequency, and $\omega_k$ is selected to control net frequency response.

15. Apparatus as defined by claim 14 wherein $\omega_k$ is selected to make net response uniform over all major harmonics.

16. Apparatus as defined by claim 15 wherein step a) includes
   i) positioning an object in a magnetic field,
   ii) obtaining magnetic resonance image signals representative of at least one velocity component of said particle at a plurality of time frames, and
   (iii) obtaining measures of said at least one velocity component during said plurality of frames.

17. Apparatus as defined by claim 16 wherein step b) includes estimating a first particle trajectory using a forward-backward integration of velocity measurements.

18. Apparatus as defined by claim 17 wherein step b) further includes using said improved trajectory from step c) iii) in an iterative process.

* * * * *

UNITED STATES PATENT AND TRADEMARK OFFICE
CERTIFICATE OF CORRECTION

PATENT NO. : 5,615,677
DATED : April 1, 1997
INVENTOR(S) : Norbert J. Pelc
Yudong Zhu It is certified that error appears in the above-identified patent and that said Letters Patent is hereby corrected as shown below:

Column 1, after the title, insert:

--The U.S. Government has rights in the invention pursuant to NIH Grant No. 5R01-HL46347-03 to Stanford University.--

Signed and Sealed this

Sixteenth Day of February, 1999

Attest:

*Acting Commissioner of Patents and Trademarks*

*Attesting Officer*